(12) United States Patent
Fukunaga et al.

(10) Patent No.: US 6,384,650 B1
(45) Date of Patent: May 7, 2002

(54) DIGITAL PHASE LOCKED LOOP CIRCUIT

(75) Inventors: Seiji Fukunaga, Tokyo; Yasuhiro Sato, Miyagi, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/560,144

(22) Filed: Apr. 28, 2000

(30) Foreign Application Priority Data

Apr. 30, 1999 (JP) .......................................... 11-124839

(51) Int. Cl.[7] ................................................ H03L 7/06
(52) U.S. Cl. .......................... 327/159; 327/150; 331/17
(58) Field of Search ................................ 327/146, 147, 327/150, 155, 156, 159; 331/1 A, 17; 375/376

(56) References Cited

U.S. PATENT DOCUMENTS

| | | | | |
|---|---|---|---|---|
| 6,097,560 A | * | 8/2000 | Tanaka et al. | 360/51 |
| 6,114,261 A | * | 11/2000 | Goto et al. | 331/17 |
| 6,144,261 A | * | 11/2000 | Goto et al. | 331/17 |

FOREIGN PATENT DOCUMENTS

| | | |
|---|---|---|
| JP | 3-16318 | 1/1991 |
| JP | 5-90961 | 4/1993 |
| JP | 5-243980 | 9/1993 |
| JP | 6-132819 | 5/1994 |

* cited by examiner

*Primary Examiner*—Toan Tran
*Assistant Examiner*—Quan Tra
(74) *Attorney, Agent, or Firm*—Young & Thompson

(57) ABSTRACT

A digital PLL circuit, which can realize a high accurate hold-over function even in case that power supply voltage or ambient temperature is changed, is provided. The digital PLL circuit provides a first, a second and a third loop circuits. In the third loop circuit, an adder and a differentiator calculate a difference between a frequency of a signal outputted from a fixed frequency oscillator and an output frequency, and a memory circuit memorizes the difference calculated at the adder and the differentiator, and another adder compares the difference between the frequency of the signal outputted from the fixed frequency oscillator and a current output frequency with the difference memorized in the memory circuit. And a frequency of a signal outputting from a voltage controlled oscillator (VCO) is controlled by the compared result.

7 Claims, 2 Drawing Sheets

DIGITAL PHASE LOCKED LOOP CIRCUIT

BACKGROUND OF THE INVENTION

The present invention relates to a digital phase locked loop (PLL) circuit, in particular, which has a plurality of loop circuits.

DESCRIPTION OF THE RELATED ART

FIG. 1 is a block diagram showing a structure of a conventional digital PLL circuit. The conventional digital PLL circuit consists of a frequency divider 1 which divides a frequency of an output signal, an adder 2 which subtracts the output signal whose frequency is divided at the frequency divider 1 from an inputted signal and outputs the subtracted signal as a stationary phase difference, a constant multiplier 3 which multiplies the stationary phase difference outputted from the adder 2 by a constant K1, a constant multiplier 13 which multiplies the stationary phase difference multiplied the constant K1 at the constant multiplier 3 by a constant K2, an integrator 4 which integrates the stationary phase differences multiplied the constant K2 at the constant multiplier 13, an adder 42 which adds the stationary phase difference multiplied the constant K1 at the constant multiplier 3 and the stationary phase differences integrated at the integrator 4 and outputs the added result, a digital to analog converter (DAC) 5 which converts a digital signal outputted from the adder 42 to an analog signal, and a voltage controlled oscillator (VCO) 6 which outputs a signal having a frequency based on the analog signal converted at the DAC 5, and a frequency of the output signal outputted from the VCO 6 is divided at the frequency divider 1. In this structure, a first loop circuit is composed of the frequency divider 1, the adder 2, the constant multiplier 3, the adder 42, the DAC 5, and the VCO 6, and a second loop circuit is composed of the frequency divider 1, the adder 2, the constant multiplier 3, the constant multiplier 13, the integrator 4, the adder 42, the DAC 5, and the VCO 6.

Next, an operation of this conventional digital PLL circuit is explained. First, a frequency of a signal outputted from the VCO 6 is divided into 1/N at the frequency divider 1 and the signal whose frequency is divided is inputted to the adder 2.

At the adder 2, the signal whose frequency is divided at the frequency divider 1 is subtracted from an inputted signal and the subtracted result is outputted as a stationary phase difference. That is, a phase difference corresponding to the difference between a frequency of the inputted signal and a free-running frequency of the VCO 6 is outputted from the adder 2 as the stationary phase difference.

At the constant multiplier 3, the stationary phase difference outputted from the adder 2 is multiplied by a constant K1 and the stationary phase difference multiplied by the constant K1 is outputted to the constant multiplier 13 and the adder 42.

At the constant multiplier 13, the stationary phase difference multiplied the constant K1 at the constant multiplier 3 is multiplied by a constant K2 and the stationary phase difference multiplied the constant K2 is outputted to the integrator 4.

At the integrator 4, the stationary phase differences multiplied the constant K2 at the constant multiplier 13 are integrated.

At the adder 42, the stationary phase difference multiplied the constant K1 at the constant multiplier 3 and the stationary phase differences integrated at the integrator 4 are added and the added result is outputted.

The digital signal outputted from the adder 42 is inputted to the DAC 5, and the digital signal inputted to the DAC 5 is converted to an analog signal, and the converted analog signal is outputted to the VCO 6.

At the VCO 6, a signal having a frequency based on the signal outputted from the DAC 5 is outputted as an output signal.

By a series of the feedback operation mentioned above, when a phase difference corresponding to the difference between a frequency of the inputted signal and a free-running frequency of the VCO 6, that is, the stationary phase difference outputted from the adder 2 becomes equal to the stationary phase difference outputted from the adder 2 at the previous feedback operation, the frequency is pulled in to the loop circuits and the phase is locked.

At transmitting equipment, especially at a synchronous multiplexer used a structure called a synchronous digital hierarchy (SDH), in case that a clock source to be synchronized is lost, it is required that a synchronizing clock frequency is memorized and the synchronizing clock frequency is held for a long period of time. This function is called a hold-over function.

In this conventional example, when the clock source to be synchronized is lost, the output from the constant multiplier 3 is forced to be zero. With this, the both first and second loop circuits are cut, and the difference between the frequencies of the inputted signals integrated at the integrator 4 and the free-running frequency of the VCO 6 is made to be a constant, and by using the difference made to be a constant, the frequency of the signal outputted from the VCO 6 via the adder 42 and the DAC 5 is controlled to be a constant, and the hold-over function is realized.

However, in case that the clock source to be synchronized is lost and the hold-over function mentioned above is made to work, the analog voltage outputting from the DAC 5 and the free-running frequency of the VCO 6 are largely changed by the change of power supply voltage or ambient temperature. Therefore, in order that the function of hold-over is made to be a stable operation for a long period of time, the change of the power supply voltage or the ambient temperature must be made to be as small as possible, and there is a problem that the cost to solve the matter becomes large.

SUMMARY OF THE INVENTION

It is therefore an object of the present invention to provide a digital phase locked loop (PLL) circuit that can realize a high accurate function of hold-over even when power supply voltage fluctuates and ambient temperature changes.

According to a first aspect of the present invention for achieving the object mentioned above, at a digital PLL circuit, which provides a first and a second loop circuits that make an inputted frequency and an output frequency equivalent by a feedback operation of the phase of said output frequency, and in which in case that a clock source to be synchronized is lost, a clock frequency being synchronized is memorized and held for a long period of time, the digital PLL circuit provides a third loop circuit which compares said output frequency with a predetermined constant frequency and uses the compared result for the feedback operation at said first and second loop circuits.

According to a second aspect of the present invention in the first aspect, said third loop circuit provides a fixed frequency oscillator which outputs a signal having a predetermined constant frequency, a calculating means for calculating a difference between said frequency of said signal outputted from said fixed frequency oscillator and said output frequency, a memorizing means for memorizing said difference calculated at said calculating means, a comparing means for comparing a difference between said frequency of said signal outputted from said fixed frequency oscillator and a current output frequency with said difference memorized in said memorizing means, and a voltage controlled oscillator (VCO) which outputs a signal having a frequency based on the compared result at said comparing means. And control is performed so that said difference between said frequency of said signal outputted from said fixed frequency oscillator and said current output frequency, and said difference memorized in said memorizing means are made to be equal.

According to a third aspect of the present invention in the second aspect, said calculating means, to which a signal that the frequency of said signal outputted from said fixed frequency oscillator is divided and a signal that the frequency of said output frequency is divided are inputted, calculates a difference between said frequency of said signal outputted from said fixed frequency oscillator and said output frequency, based on said inputted signals.

According to a fourth aspect of the present invention in the third aspect, said calculating means provides an adder which subtracts said frequency of said signal outputted from said fixed frequency oscillator from said output frequency, and a differentiator which calculates said difference between said frequency of said signal outputted from said fixed frequency oscillator and said output frequency by applying a differential operation for said signal outputted from said adder.

According to a fifth aspect of the present invention in the fourth aspect, said third loop circuit defined in claim 1 provides an average value calculating means for calculating an average value of said differences of frequencies calculated at said differentiator. And said memorizing means memorizes said average value calculated at said average value calculating means, and said comparing means compares an average value of said differences between said frequency of said signal outputted from said fixed frequency oscillator and said current output frequencies with said average value memorized in said memorizing means.

According to a sixth aspect of the present invention in the fifth aspect, said average calculating means is a low pass filter.

According to the structure of the present invention, at said calculating means in said third loop circuit, said difference between said frequency of said signal outputted from said fixed frequency oscillator and said output frequency is calculated, and the calculated difference is memorized in said memorizing means. And at said comparing means, said difference between said frequency of said signal outputted from said fixed frequency oscillator and said current output frequency, and said difference memorizing in said memorizing means, are compared, and a signal having a frequency based on said compared result is outputted from said VCO. With this operation, it is controlled that said difference between said frequency of said signal outputted from said fixed frequency oscillator and said current output frequency, and said difference memorizing in said memorizing means, are made to be equal.

At the present invention, said third loop circuit, which works at the time when the operation is shifted to a hand-over function, is provided, therefore, the hand-over operation can be improved to be stable for a long period of time.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
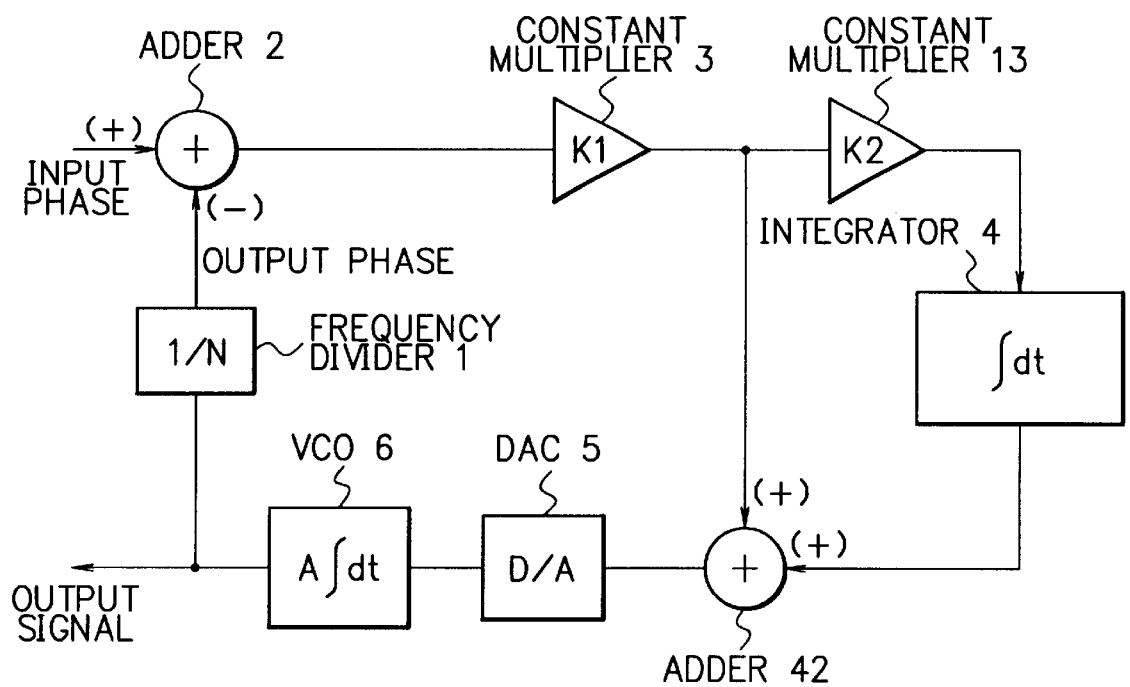
FIG. 1 is a block diagram showing a structure of a conventional digital PLL circuit.
Figure 2:
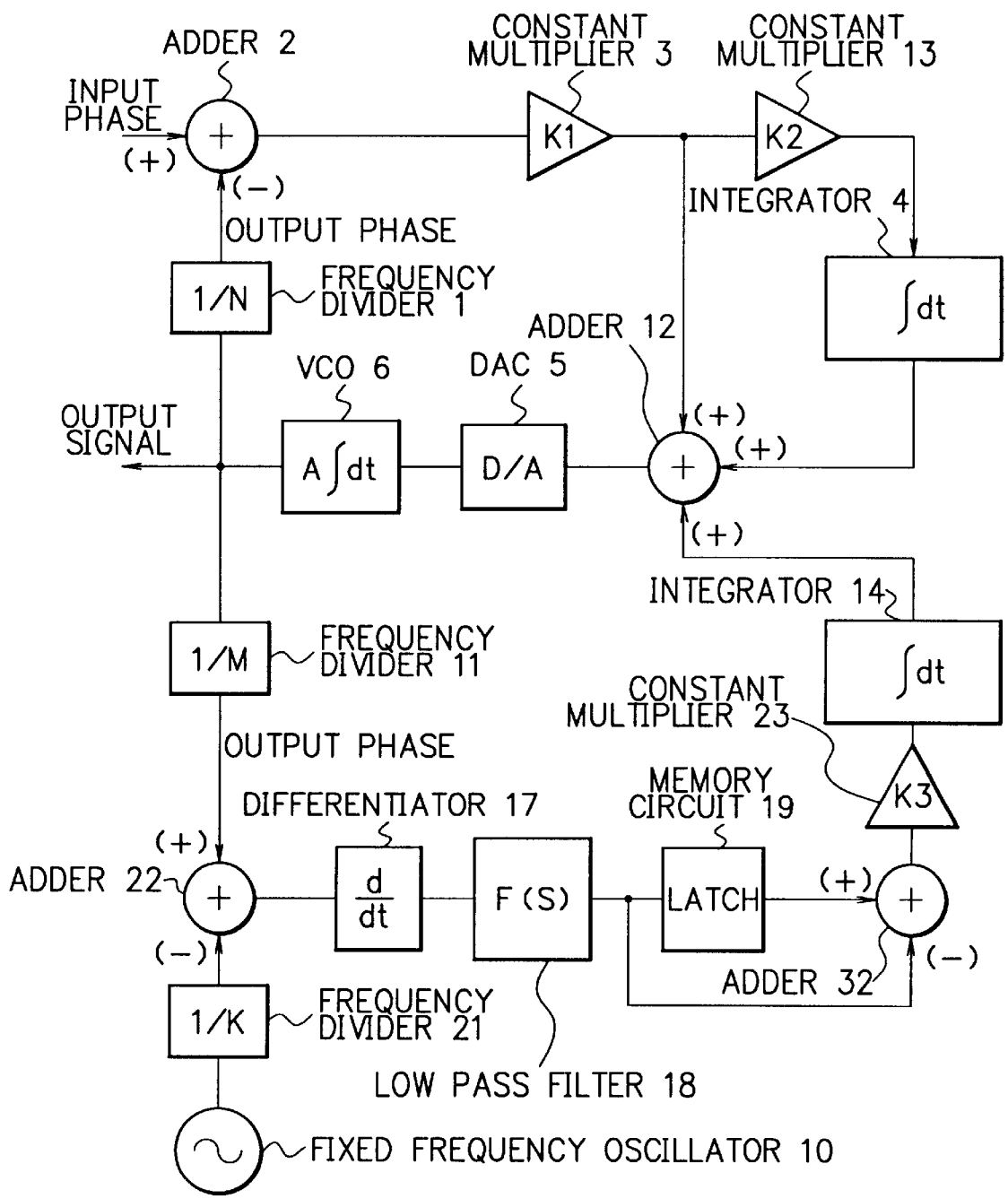
FIG. 2 is a block diagram showing a structure of an embodiment of a digital PLL circuit of the present invention.

Referring now to the drawing, an embodiment of the present invention is explained in detail. FIG. 2 is a block diagram showing a structure of the embodiment of a digital PLL circuit of the present invention.

As shown in FIG. 2, the digital PLL circuit of the present invention consists of frequency dividers 1 and 11 which divide a frequency of an output signal, an adder 2 which subtracts the output signal whose frequency is divided at the frequency divider 1 from an inputted signal and outputs the subtracted signal as a stationary phase difference, a constant multiplier 3 which multiplies the stationary phase difference outputted from the adder 2 by a constant K1, a constant multiplier 13 which multiplies the stationary phase difference multiplied the constant K1 at the constant multiplier 3 by a constant K2, an integrator 4 which integrates the stationary phase differences multiplied the constant K2 at the constant multiplier 13, a fixed frequency oscillator 10 which outputs a signal having a predetermined constant frequency, a frequency divider 21 which divides a frequency of the signal outputted from the fixed frequency oscillator 10, an adder 22 which subtracts the signal whose frequency is divided at the frequency divider 21 from the signal whose frequency is divided at the frequency divider 11 and outputs the subtracted result, a differentiator 17 which is a calculating means with the adder 22 and calculates the difference between the frequency of the output signal and the frequency of the signal outputted from the fixed frequency oscillator 10 by applying a differential operation for the signal outputted from the adder 22, a low pass filter 18 which is an average value calculating means and calculates the average value of the differences of the frequencies calculated at the differentiator 17, a memory circuit 19 which latches the average value calculated at the low pass filter 18 and outputs the average value, an adder 32 which is a comparing means and subtracts the signal outputted from the low pass filter 18 from the signal outputted from the memory circuit 19 and outputs the subtracted result, a constant multiplier 23 which multiplies the signal outputted from the adder 32 by a constant K3, an integrator 14 which integrates the signals multiplied the constant K3 at the constant multiplier 23, an adder 12 which adds the stationary phase difference multiplied the constant K1 at the constant multiplier 3 and the stationary phase differences integrated at the integrator 4 and the signals integrated at the integrator 14, and outputs the added result, a digital to analog converter (DAC) 5 which converts a digital signal outputted from the adder 12 to an analog signal, and a voltage controlled oscillator (VCO) 6 which outputs a signal having a frequency based on the analog signal converted at the DAC 5, and a frequency of the output signal outputted from the VCO 6 is divided at the frequency dividers 1 and 11. In this structure, a first loop circuit is composed of the frequency divider 1, the adder 2, the constant multiplier 3, the adder 12, the DAC 5, and the VCO 6, and a second loop circuit is composed of the frequency divider 1, the adder 2, the constant multiplier 3, the constant multiplier 13, the integrator 4, the adder 12, the DAC 5, and the VCO 6, and a third loop circuit is composed of the frequency dividers 11 and 21, the fixed frequency oscillator 10, the adder 22, the differentiator 17, the low pass filter 18, the memory circuit 19, the adder 32, the constant multiplier 23, the integrator 14, the adder 12, the DAC 5, and the VCO 6.

Next, an operation of the digital PLL circuit of the present invention is explained. First, a signal outputted from the VCO 6 is divided into 1/N at the frequency divider 1 and the signal whose frequency is divided is inputted to the adder 2.

At the adder 2, the signal whose frequency is divided at the frequency divider 1 is subtracted from an inputted signal and the subtracted result is outputted as a stationary phase difference. That is, a phase difference corresponding to the difference between a frequency of the inputted signal and a free-running frequency of the VCO 6 is outputted from the adder 2 as the stationary phase difference.

At the constant multiplier 3, the stationary phase difference outputted from the adder 2 is multiplied by a constant K1 and the stationary phase difference multiplied the constant K1 is outputted to the constant multiplier 13 and the adder 12.

At the constant multiplier 13, the stationary phase difference multiplied the constant K1 at the constant multiplier 3 is multiplied by a constant K2 and the stationary phase difference multiplied the constant K2 is outputted to the integrator 4.

At the integrator 4, the stationary phase differences multiplied the constant K2 at the constant multiplier 13 are integrated.

The output signal outputted from the VCO 6 is also inputted to the frequency divider 11 and divided into 1/M at the frequency divider 11 and the divided result is inputted to the adder 22.

A signal outputted from the fixed frequency oscillator 10 is divided into 1/K at the frequency divider 21 and the divided result is inputted to the adder 22.

At the adder 22, the signal whose frequency is divided at the frequency divider 21 is subtracted from the signal whose frequency is divided at the frequency divider 11 and the subtracted result is outputted.

The subtracted result at the adder 22 is inputted to the differentiator 17 and a differential operation is applied to the subtracted result at the differentiator 17. In this, the differential result at the differentiator 17 becomes the difference between the frequency of the output signal and the frequency of the signal outputted from the fixed frequency oscillator 10.

The differential result at the differentiator 17 is inputted to the low pass filter 18, at the low pass filter 18, an average value of the differences between the frequencies of the output signals and the frequencies of the signals outputted from the fixed frequency oscillator 10 is calculated.

The average value calculated at the low pass filter 18 is inputted to the memory circuit 19 and the adder 32. At the memory circuit 19, the inputted average value is memorized temporarily.

After this, at the adder 32, the average value outputted from the low pass filter 18 is subtracted from the average value memorized temporarily in the memory circuit 19, and the subtracted result is outputted.

The subtracted result at the adder 32 is inputted to the constant multiplier 23, and a constant K3 is multiplied to the subtracted result at the constant multiplier 23.

The signal multiplied the constant K3 at the constant multiplier 23 is inputted to the integrator 14, and the multiplied signals are integrated at the integrator 14.

At the adder 12, the stationary phase difference multiplied by the constant K1 at the constant multiplier 3 and the stationary phase differences integrated at the integrator 4 and the signals integrated at the integrator 14 are added and the added result is outputted.

The digital signal outputted from the adder 12 is inputted to the DAC 5, and the digital signal inputted to the DAC 5 is converted to an analog signal, and the converted analog signal is outputted to the VCO 6.

At the VCO 6, a signal having a frequency based on the signal outputted from the DAC 5 is outputted as an output signal.

By a series of the feedback operation mentioned above, when a phase difference corresponding to the difference between the frequency of the input signal and the free-running frequency of the VCO 6, that is, the stationary phase difference outputted from the adder 2 becomes equal to the stationary phase difference outputted from the adder 2 at the previous feedback operation, a pull in operation to the loop is locked.

In this, in case that the operation is shifted to the hold-over, the first and second loop circuits are cut by that the output from the constant multiplier 3 is fixed to zero forcibly. With this operation, the difference between the frequency of the input signal integrated at the integrator 4 and the free-running frequency of the VCO 6 becomes a constant, an initial frequency at the hold-over operation is stabilized.

At the memory circuit 19, by stopping the memorizing operation of the signal outputted from the low pass filter 18, the difference between the frequency of the output signal at right before time when the operation is shifted to the hold-over and the frequency of the signal outputted from the fixed frequency oscillator 10 is memorized in the memory circuit 19. With this operation, the third loop circuit works newly.

At the adder 32 in the third loop circuit, the average value of the frequency difference calculated at the low pass filter 18 and the frequency difference memorized in the memory circuit 19 at right before time when the operation is shifted to the hold-over are compared.

The output from the adder 32 appears as a frequency difference between the output signals at the time before and after the operation is shifted to the hold-over, and the frequency difference is multiplied by the constant K3 at the constant multiplier 23 and the multiplied result is integrated at the integrator 14.

The frequency differences integrated at the integrator 14 are added to the signals integrated at the integrator 4 at the adder 12, and the added result is converted to an analog voltage at the DAC 5.

After this operation, at the VCO 6, based on the signal converted to the analog voltage at the DAC 5, the frequency of the output signal is controlled to be the difference between the frequency of the output signal, at the time before the operation is shifted to the hold-over, memorized in the memory circuit 19, and the frequency of the signal outputted from the fixed frequency oscillator 10.

As mentioned above, at the digital PLL circuit of the present invention, in the third loop circuit, the frequency difference between the frequency of the output signal after the operation is shifted to the hold-over and the frequency of the fixed frequency oscillator is controlled to become equal to the frequency difference between the frequency of the output signal memorized in the memory circuit before the operation is shifted to the hold-over and the frequency of the fixed frequency oscillator. With this operation, when the operation is shifted to the hold-over, the frequency of the output signal can be controlled by the third loop circuit.

Therefore, the high accurate and stable hold-over operation can be realized for a long period of time, only by making the fixed frequency oscillator highly stable, with not influenced by an error of circuits such as the change of the free-running frequency of the VCO caused by the fluctuation of the power supply voltage and the change of the ambient temperature.

While the present invention has been described with reference to the particular illustrative embodiment, it is not to be restricted by that embodiment but only by the appended claims. It is to be appreciated that those skilled in the art can change or modify the embodiment without departing from the scope and spirit of the present invention.

What is claimed is:

1. A digital phase locked loop (PLL) circuit, which provides a first loop circuit based on a stationary phase difference multiplied by a first constant multiplier and a second loop circuits based on the stationary phase difference multiplied by the first constant multiplier and a second constant multiplier, the first and second loop circuits being constructed to set an input frequency equivalent to an output frequency equivalent by a feedback operation, and in which in case that a clock source to be synchronized is lost, a clock frequency being synchronized is memorized and held, the digital PLL circuit comprising:
    a third loop circuit which compares said output frequency with a predetermined constant frequency and uses the compared result for the feedback operation at said first and second loop circuits, said third loop circuit, comprising:
        a fixed frequency oscillator which outputs a signal having the predetermined constant frequency;
        a calculating means for calculating a difference between said frequency of said signal outputted from said fixed frequency oscillator and said output frequency;
        a memorizing means for memorizing said difference calculated at said calculating means;
        a comparing means for comparing a difference between said frequency of said signal outputted from said fixed frequency oscillator and a current output frequency with said difference memorized in said memorizing means; and
        a voltage controlled oscillator (VCO) which outputs a signal having a frequency based on the compared result at said comparing means,
            wherein: control is performed so that said difference between said frequency of said signal outputted from said fixed frequency oscillator and said current output frequency, and said difference memorized in said memorizing means are made to be equal.

2. A digital PLL circuit in accordance with claim 1, wherein:
    said calculating means, to which a signal that the frequency of said signal outputted from said fixed frequency oscillator is divided,and a signal that the frequency of said output frequency is divided are inputted, calculates a difference between said frequency of said signal outputted from said fixed frequency oscillator and said output frequency, based on said inputted signals.

3. A digital PLL circuit in accordance with claim 2, wherein:
    said calculating means, comprising:
        an adder which subtracts said frequency of said signal outputted from said fixed frequency oscillator from said output frequency; and
        a differentiator which calculates said difference between said frequency of said signal outputted from said fixed frequency oscillator and said output frequency by applying a differential operation for said signal outputted from said adder.

4. A digital PLL circuit in accordance with claim 3, wherein:
    said third loop circuit, comprising:
        an average value calculating means for calculating an average value of said differences of frequencies calculated at said differentiator,
            wherein: said memorizing means memorizes said average value calculated at said average value calculating means; and
            said comparing means compares an average value of said differences between said frequency of said signal outputted from said fixed frequency oscillator and said current output frequencies with said average value memorized in said memorizing means.

5. A digital PLL circuit in accordance with claim 4, wherein:
    said average calculating means is a low pass filter.

6. A digital phase locked loop (PLL) circuit comprising:
    a first adder having as inputs an input signal and a frequency divided version of an output signal, the first adder producing as an output a stationary phase difference;
    a second adder having as a first input the stationary phase difference multiplied by a first multiplier and as a second input the stationary phase difference multiplied by both the first multiplier and a second multiplier, and integrated by an integrator;
    a digital to analog converter and voltage controlled oscillator, which receive an output of the second adder and produce as an output the output signal; and
    a, feedback path between the output signal and a third input of the second adder, said feedback path being constructed to compare a frequency of the output signal with a predetermined constant frequency.

7. The digital PLL circuit of claim 6, wherein the feedback path comprises:
    a fixed frequency oscillator which outputs a signal having the predetermined constant frequency;
    a calculating means for calculating a difference between said frequency of said signal outputted from said fixed frequency oscillator and said output frequency;
    a memorizing means for memorizing said difference calculated at said calculating means;
    a comparing means for comparing a difference between said frequency of said signal outputted from said fixed frequency oscillator and a current output frequency with said difference memorized in said memorizing means; and
    a second voltage controlled oscillator (VCO) which outputs a signal having a frequency based on the compared result at said comparing means;
        wherein control is performed so that said difference between said frequency of said signal outputted from said fixed frequency oscillator and said current output frequency, and said difference memorized in said memorizing means are made to be equal.

* * * * *